(12) United States Patent
Kalluri et al.

(10) Patent No.: US 11,754,420 B2
(45) Date of Patent: Sep. 12, 2023

(54) ACCURACY IMPROVEMENT IN LINEAR VARIABLE DIFFERENTIAL TRANSFORMER BASED POSITION MEASUREMENTS

(71) Applicant: Hamilton Sundstrand Corporation, Charlotte, NC (US)

(72) Inventors: Nageswara Rao Kalluri, Karnataka (IN); Sridhar Katakam, Bangalore (IN); Somasekhar Valleru, Bangalore (IN); Pravinsharma Kaliyannan Eswaran, Karnataka (IN); Rajkumar Perumal, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 287 days.

(21) Appl. No.: 17/169,974

(22) Filed: Feb. 8, 2021

(65) Prior Publication Data
US 2022/0187103 A1    Jun. 16, 2022

(30) Foreign Application Priority Data

Dec. 12, 2020    (IN) .............................. 202011054153

(51) Int. Cl.
*G01D 5/22* (2006.01)
*H01F 21/06* (2006.01)
*H03G 3/30* (2006.01)

(52) U.S. Cl.
CPC ........... *G01D 5/2291* (2013.01); *H01F 21/06* (2013.01); *H03G 3/3089* (2013.01); *H03G 2201/103* (2013.01)

(58) Field of Classification Search
None
See application file for complete search history.

(56) References Cited

U.S. PATENT DOCUMENTS 4,335,442 A    6/1982    Backe
4,855,925 A    8/1989    Bhateja
(Continued)

FOREIGN PATENT DOCUMENTS

CN    110631469 A    12/2019
EP    1331470 A1    7/2003
IN    201201049 E1    9/2013

OTHER PUBLICATIONS

European Search Report for Application No. 21212874.8, dated Apr. 19, 2022, 52 pages.

*Primary Examiner* — Nasima Monsur
(74) *Attorney, Agent, or Firm* — CANTOR COLBURN LLP

(57) ABSTRACT

System and methods for accuracy improvement of an LVDT are provided. Aspects include determining a first voltage from the first PGA and a second voltage from the second PGA, wherein the first voltage is determined from a PGA coupled to a first secondary winding, and wherein the second voltage is determined from a second PGA coupled to a second secondary winding, iteratively performing: analyzing the first voltage to determine a gain correction is needed for a first gain for the first PGA, the gain correction comprising change to the first gain, and analyzing the second voltage to determine a gain correction is needed for a second gain for the second PGA, the gain correction comprising change to the second gain, based on determining a gain correction is not needed for the first gain and the second gain, calculating a position based on the first voltage and the second voltage.

18 Claims, 6 Drawing Sheets

(56) References Cited

U.S. PATENT DOCUMENTS

| | | | |
|---|---|---|---|
| 5,327,030 A | 7/1994 | Devito et al. | |
| RE35,996 E | 12/1998 | Rasmussen | |
| 6,823,028 B1 * | 11/2004 | Phanse | H04L 25/085 375/345 |
| 2003/0141917 A1 * | 7/2003 | McBrien | G01D 5/2266 327/304 |
| 2012/0237010 A1 * | 9/2012 | Hurwitz | H04M 11/062 379/90.01 |
| 2016/0197620 A1 | 7/2016 | Gore et al. | |
| 2017/0149343 A1 * | 5/2017 | Bhandarkar | H02M 5/458 |
| 2020/0110582 A1 | 4/2020 | Katsu et al. | |

* cited by examiner

ACCURACY IMPROVEMENT IN LINEAR VARIABLE DIFFERENTIAL TRANSFORMER BASED POSITION MEASUREMENTS

CROSS-REFERENCE TO RELATED APPLICATIONS

This application claims the benefit of Indian Patent Application No. 202011054153 filed Dec. 12, 2020, which is incorporated herein by reference in its entirety.

BACKGROUND

The present invention generally relates to linear variable differential transformers (LVDT), and more specifically, to accuracy improvement near full scale position in LVDT based position measurements.

An LVDT is a type of electrical transformer that is typically used for measuring linear displacement. The LVDT has a tube wrapped by three solenoidal coils and utilizes a cylindrical ferromagnetic core that is usually attached to an object whose position is to be measured which slides along the axis of the tube.

LVDTs are used in applications such as, for example, power turbines, hydraulics, automation, aircraft, satellites, nuclear reactors, and the like. The LVDT converts a position or linear displacement from a mechanical reference (zero or null position) into a proportional electrical signal containing phase (for direction) and amplitude (for distance) information. The LVDT operation does not require an electrical contact between the moving part (probe or core assembly) and the coil assembly, but instead relies on electromagnetic coupling.

BRIEF DESCRIPTION

Embodiments of the present invention are directed to a system. A non-limiting example of the system includes a transformer comprising a plurality of secondary windings, the plurality of secondary windings comprising a first secondary winding and a second secondary winding, a first programmable-gain amplifier (PGA) coupled to the first secondary winding, a second programmable-gain amplifier (PGA) coupled to the second secondary winding, and a controller configured to determining a first voltage from the first PGA and a second voltage from the second PGA, iteratively perform analyzing the first voltage to determine a gain correction is needed for a first gain for the first PGA, wherein the gain correction comprises a change to the first gain, and analyzing the second voltage to determine a gain correction is needed for a second gain for the second PGA, wherein the gain correction comprises a change to the second gain, and based on a determination that a gain correction is not needed for the first gain and the second gain, calculate a position measurement based on the first voltage and the second voltage.

Embodiments of the present invention are directed to a method. A non-limiting example of the method includes determining a first voltage from the first PGA and a second voltage from the second PGA, wherein the first voltage is determined from a PGA coupled to a first secondary winding, and wherein the second voltage is determined from a second PGA coupled to a second secondary winding, iteratively performing: analyzing the first voltage to determine a gain correction is needed for a first gain for the first PGA, the gain correction comprising change to the first gain, and analyzing the second voltage to determine a gain correction is needed for a second gain for the second PGA, the gain correction comprising change to the second gain, based on determining a gain correction is not needed for the first gain and the second gain, calculating a position based on the first voltage and the second voltage.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
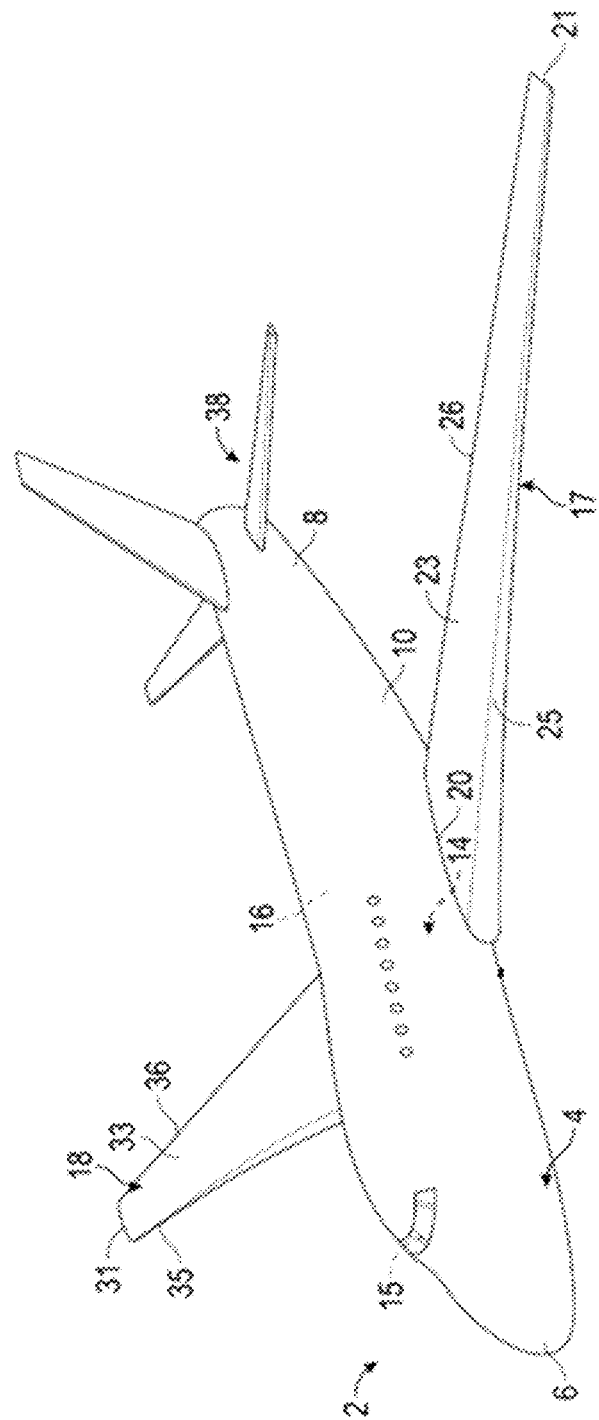
FIG. 1 is a perspective view of an aircraft that may incorporate embodiments of the present disclosure.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Referring now to the figures, a perspective view of an aircraft 2 that may incorporate embodiments of the present disclosure. Aircraft 2 includes a fuselage 4 extending from a nose portion 6 to a tail portion 8 through a body portion 10. Body portion 10 houses an aircraft cabin 14 that includes a crew compartment 15 and a passenger or cargo compartment 16. Body portion 10 supports a first wing 17 and a second wing 18. First wing 17 extends from a first root portion 20 to a first tip portion 21 through a first airfoil portion 23. First airfoil portion 23 includes a leading edge 25 and a trailing edge 26. Second wing 18 extends from a second root portion (not shown) to a second tip portion 31 through a second airfoil portion 33. Second airfoil portion 33 includes a leading edge 35 and a trailing edge 36. Tail portion 8 includes a stabilizer 38. Aircraft 2 includes an engine 54 configured to provide propulsion to the aircraft 2.

Turning now to an overview of technologies that are more specifically relevant to aspects of the disclosure, in most aerospace applications, LVDT or linear voltage differential transformers are a common sensor. An LVDT is a type of electrical transformer used for measuring linear displacement. An LVDT, typically, includes a primary winding excited with a low frequency sinusoidal AC voltage to measure linear positional measurement from its secondary feedbacks. It has two (2) secondary output voltage which changes their amplitude based on the linear position (in mm). Equation [1] provides the relation between secondary voltages to the position. Where the Constant is a conversion factor between secondary voltage to final position. The Sec 1 is the voltage of the first secondary winding and the Sec 2 is the voltage of the second secondary winding in the transformer. This equation is utilized to determine position in mm.

$$\text{Position, in mm} = \text{Constant}*(\text{Sec1}-\text{Sec2})/(\text{Sec1}+\text{Sec2}) \quad [1]$$

Figure 2:
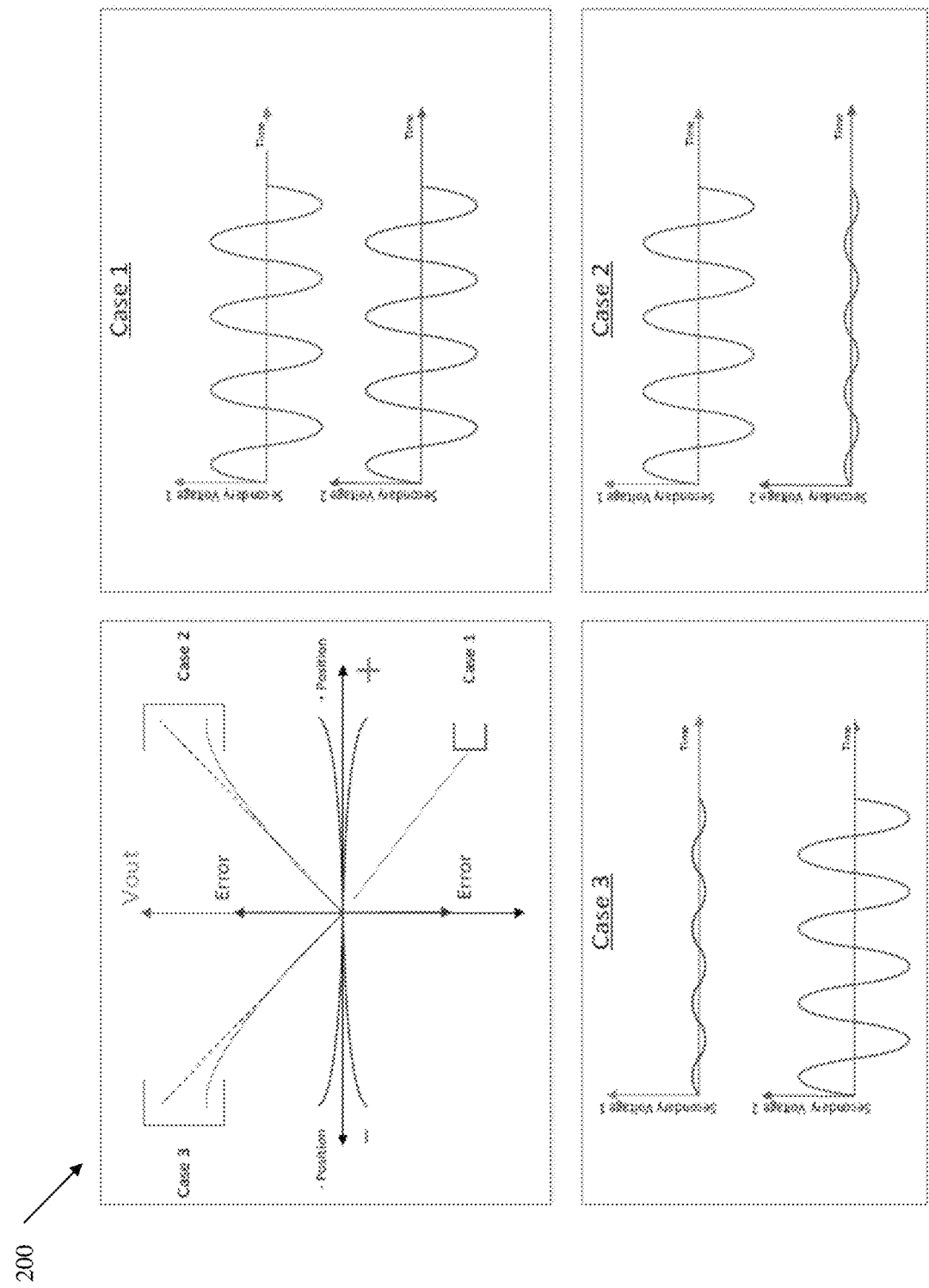
FIG. 2 is a graphical depiction of an LVDT position versus the differential voltage at different positions according to one or more embodiments.

In general, these position measurements are of a very low bandwidth type which is in the ranges of between 1 Hz to 100 Hz. The sinusoidal AC excitation frequency for these low band width positional measurements are in the range of 1.5 kHz to 3.0 kHz. Linear position measurements using LVDT sensors lack accuracy near full scale due to various reasons. As the measurements approaching near full scale, one of the LVDT's secondary voltages will tend towards zero which causes errors in the final measurement. FIG. 2 is a graphical depiction of an LVDT position versus the differential voltage at different positions according to one or more embodiments. The graphs 200 illustrate the differential voltage for three different cases where in Case 2 and Case 3, the secondary voltage tends to zero due to near full scale operation for the LVDT. The conditioning (e.g., filtering, amplification, and digitization) of these secondary voltages are the same across the position measurement range (hence voltage range). This common conditioning irrespective of the voltage being applied causes significant voltage acquisition errors due to signal to noise ratio and noise floor of the measurement. The control circuitry on the LVDT will read the voltage from data conversion and calculate the position based on the transfer function from the electrical voltages. Each type of control circuitry uses a different hardware signal conditioning and voltage acquisition (e.g., DC voltage corresponding to a sinusoidal AC voltage, AC waveform peak voltage detection, AC waveform—area under the curve, DC voltage corresponding to AC RMS, and the like) before digitized in to the control circuitry by data conversion. Irrespective of the type of signal being acquired through digitization, the signal to noise ratio is poor at near full scale and at full scale.

Figure 3:
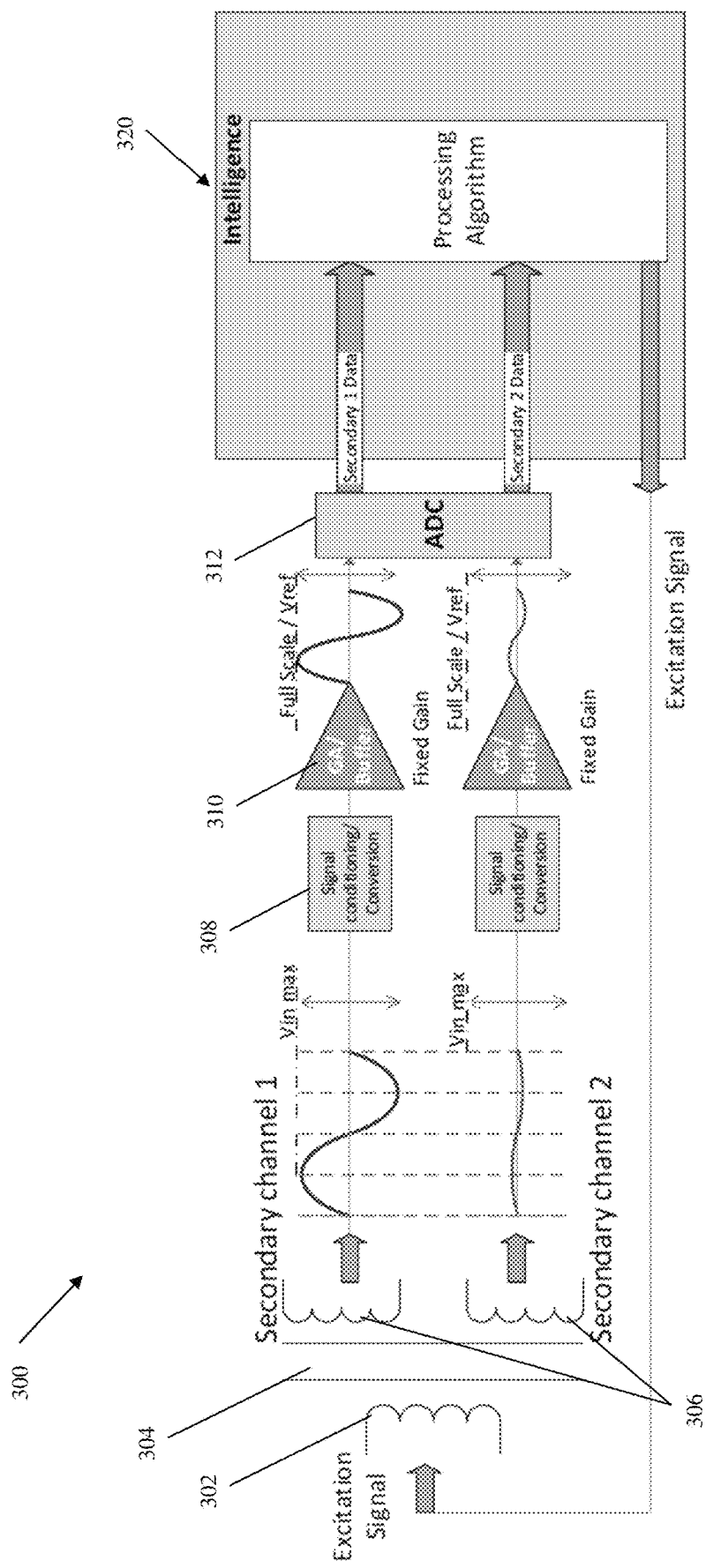
FIG. 3 depicts a diagram of an LVDT according to one or more embodiments.

The reason for poor signal to noise ration at or near full scale measurement is due to a fixed gain/attenuation in the signal chain. FIG. 3 depicts a diagram of an LVDT according to one or more embodiments. The LVDT 300 includes a transformer having a primary winding 302 and two secondary windings 306 around a linearly moveable core 304 that can be attached to a linear moveable component, which may be a linearly moveable component in a turbine engine or any component in an aircraft, for example. In the LVDT 300, AC voltage sensing (by digital conversion of each AC voltage being sampled) uses a separate signal conditioning 308 (e.g., filter, amplification/gain/attenuation) and digitation for both secondary channels (from the secondary windings 306). The gain amplifier (GA) 310 has a fixed gain for both of these secondary channels. For example, as shown in the LVDT 300, for a near scale measurement (e.g., Case 2, from FIG. 2), the secondary 1 has a higher voltage input and secondary 2 has a lower voltage input. But due to the fixed gain/attenuation, the digital data inside the intelligence has a more noise floor for secondary 2. For example, if the processing algorithm utilized by the control circuitry 320 wrongly detects a peak of the secondary 2 data and can calculate the wrong final position value. This requires to be multiple samples taken for averaging before peak detection is determine which increase the data conversion sampling rate. In addition to over sampling, reduction of signal conditioning measurement/dynamic range (10-15%) improves the near full scale accuracy. However, with this approach, a reduction in accuracy from mid-range measurements to full scale measurements can occur.

Figure 4:
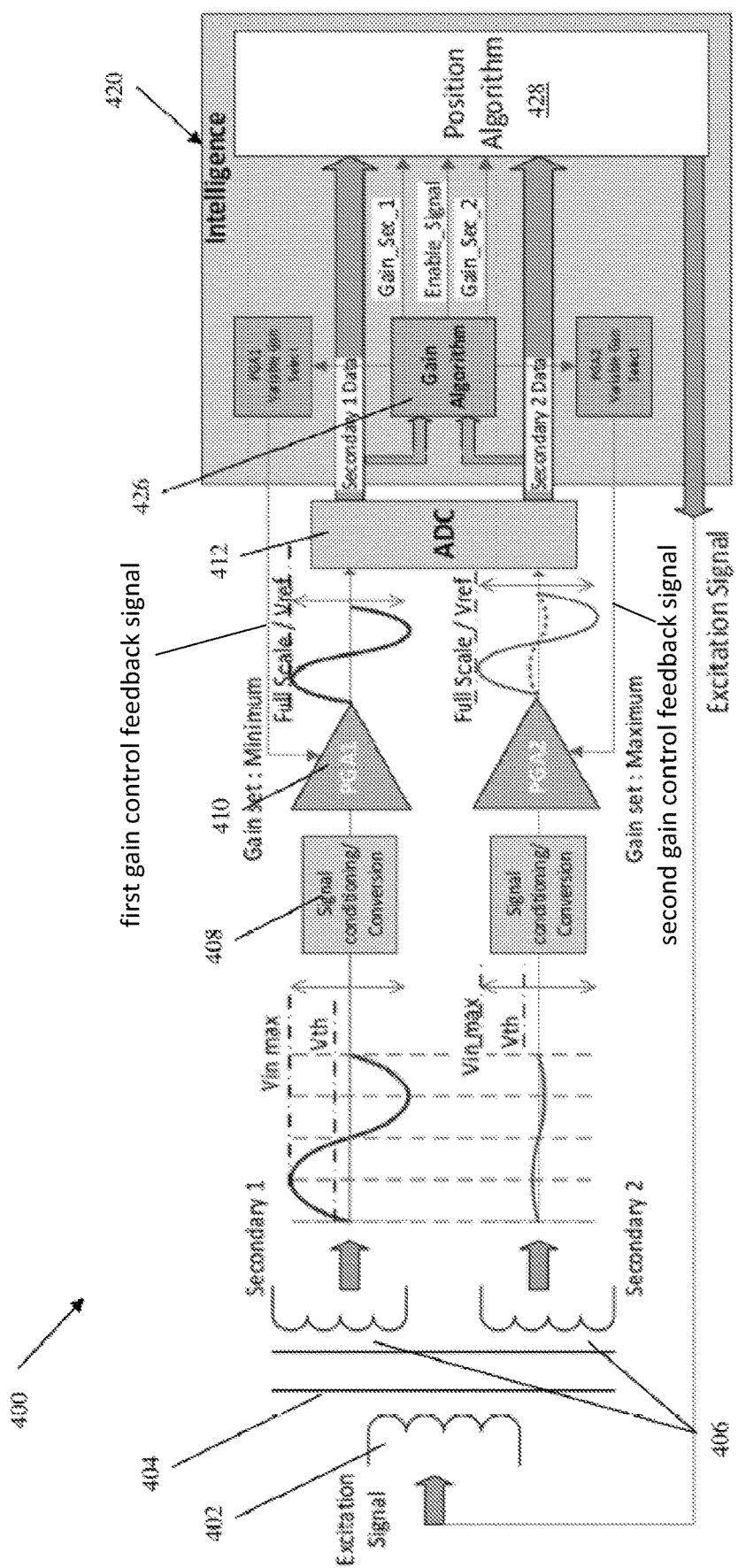
FIG. 4 depicts an LVDT having a variable gain according to one or more embodiments.

Turning now to an overview of the aspects of the disclosure, one or more embodiments address the above-described problem by providing an LVDT having a hardware variable gain that corresponds to the voltages of the secondary windings in the transformer. FIG. 4 depicts an LVDT having a variable gain according to one or more embodiments. Similar to the LVDT 300 in FIG. 3, LVDT 400 includes a transformer with a linearly moveable core 404 with a primary winding 402 and two secondary windings 406. The primary winding 402 can receive an AC excitation signal from the control circuitry 420 (sometimes referred to herein as, "controller").

The LVDT 400 interfaces a hardware PGA (programmable gain amplifier) 410 and its final position demodulation algorithm 428. The LVDT 400 can use the PGA 410 in the hardware which is interfaced to the control circuitry 420 and the position algorithm 428 and a gain algorithm 426 to set the gain/attenuation of the channel being converted into digital data. The control circuitry 420 executing the gain algorithm 426 can monitor the data from the analog to digital (ADC) 412 and compute the voltage being digitized with its current gain setting. If the voltage is within limits of a predefined value(s) of voltages, the gain of the PGA 410 remains as is. This is done for both secondary voltage signals coming from the transformer and through the ADC 412 to the control circuitry 420 executing the gain algorithm 426. The gain algorithm 426, for example, can be executing using an FPGA or other processing component in the control circuitry 420. The FPGA or other processing component executing the gain algorithm 426 can interface with another FPGA and/or processing component that executes the position algorithm 428 through an enable signal (enable_signal). If the voltage coming from the ADC 412 is not within the limits of the predefined value(s) of voltages, a new gain will be instructed to be set in the PGA 410. Simultaneously, the gain algorithm 426 disables the final position computation by the positional algorithm 428 by setting the enable signal to low for a set time (e.g., delay) while in the process of changing the gain of one or more of the PGAs 410. Once the voltages coming from the ADC are within the predefined value(s) of voltages, the enable signal is set to high and the processing algorithm can compute the final position measured by the LVDT 400.

Figure 5:
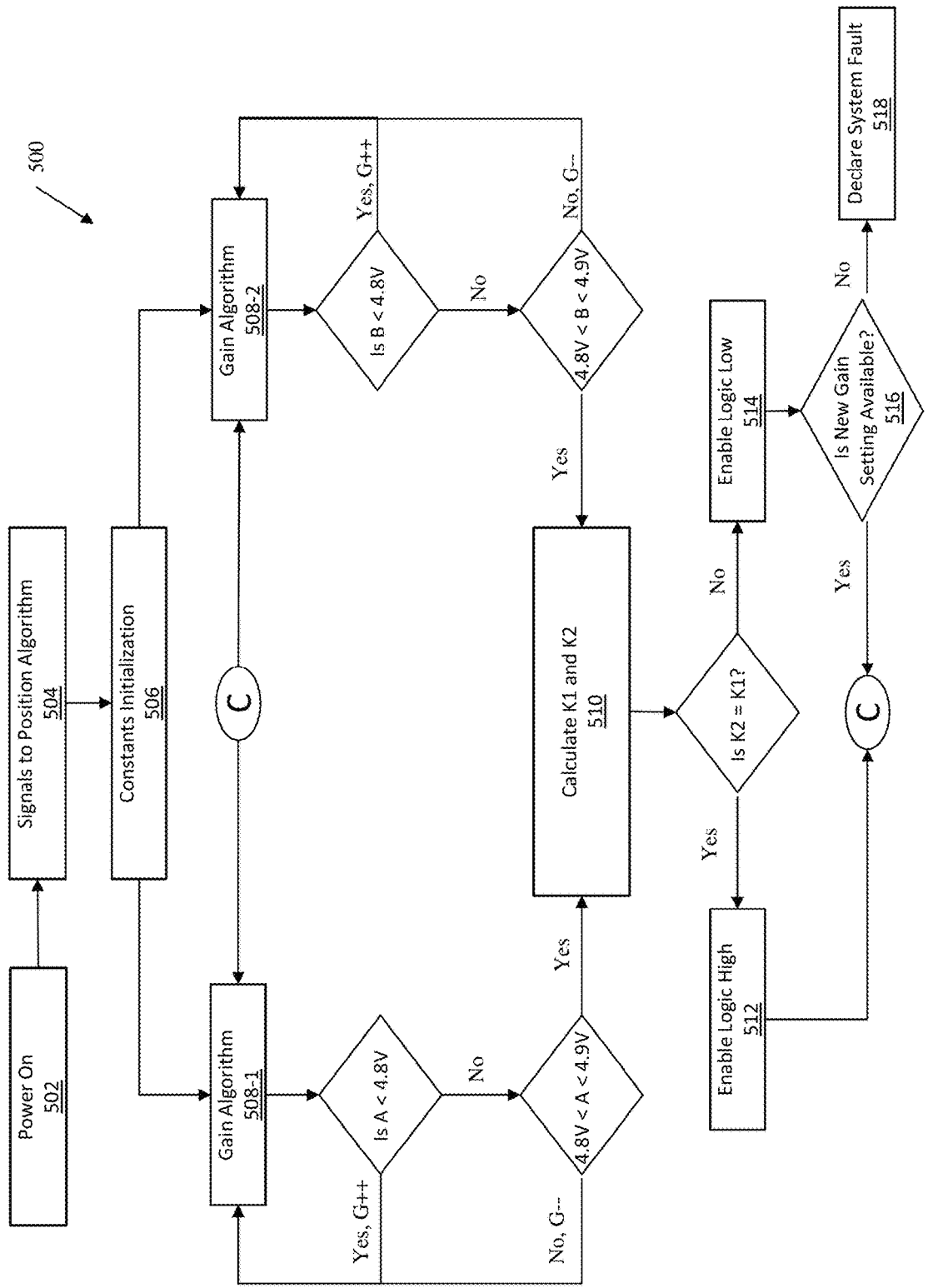
FIG. 5 depicts a flowchart for the variable gain algorithm for two secondary channels in LVDT applications according to one or more embodiments.

In one or more embodiments, the LVDT 400 can provide for a more discrete gain/attenuation setting which provides greater flexibility in gain configuration for a better accuracy of overall position measurements in a defined range. Also, based on the available gain configurations (from design, market), the gain algorithm can set the voltage values/ranges to detect for gain programmability. The variable gain algorithm 426 executed by the control circuitry 420 attempts to utilize the full scale range of the ADC 412 to maximum by increasing and decreasing the gain in the signal chain based on the amplitude of the input signals (e.g., secondary 1, secondary 2). FIG. 5 depicts a flowchart for the variable gain algorithm for two secondary channels in LVDT applications according to one or more embodiments. The variable gain algorithm executes the method 500 shown in FIG. 5. At power on 502, the gain in the signal path is set to a default value by considering a maximum possible value of the input signals. The method 500 includes signaling to the position algorithm 504 using an enable signal set to either HIGH or LOW where HIGH indicates the positional algorithm 504 is to compute the position and where LOW signals to the positional algorithm 504 to not compute the position based on the input signals. The constants are initialized next at block 506. Constant initialization includes a two-step process where step 1) begins with initializing K1 with below value in Block 506. K1=LVDT Excitation Voltage*(Transformer Ratio). K1 is the known value to the algorithm and initialized as per the design. Since the LVDT excitation voltage and the transformer ratio are based on the type of application this can be treated as a fixed value which can be initialized under block "506" Step 2 is initializing K2=0 in block 506.

The gain algorithm monitors each the secondary signals coming off the ADC as shown in blocks 508-1, 508-2. The gain algorithm then executes an iterative process to step up G++ or step down G-- the gain for the PGAs 410 (from FIG. 4). This is performed while the enable signal is at LOW from block 504 so that the positional algorithm does not calculate the position until the iterative process is complete and the enable signal is set to HIGH by the gain algorithm. The gain algorithm compares the signals to a first threshold voltage value. In the illustrated example, the first threshold voltage value is set to 4.8V for exemplary purposes. One of skill in the art could set the threshold voltage to any value based on the application or other factors. If the read value (A—secondary 1, B—secondary 2) is less than the first threshold value, the gain is increased in steps until it is above the first threshold. To avoid overflow in ADC bits, the voltages are then compared to a second threshold value (4.9 V in this example). If the read values are greater than the second threshold value, the gain is decreased in steps (i.e., No, G--). This process is iteratively completed until both read values of the voltages are between the first threshold voltage and the second threshold voltage. The variable gain algorithm is steering the gain by increment/decrement and settles once the signal to the ADC input is between the first threshold and second threshold. For these two channels of secondary signals, separate gain algorithms can be implemented in the control circuitry 420 of the LVDT 400. The gain algorithms read both secondary channels and apply the gain and verify with the transfer function as shown in block 510. Once both read voltage are between the two threshold values, the transfer function is utilized.

$$K1 = \text{LVDT Excitation Voltage} * (\text{Transformer Ratio}) \quad [2]$$

$$K2 = [(Vsec1/G1) + (Vsec2/G2)] * (\text{Transformer Ratio}) \quad [3]$$

The decision block determines whether K1=K2 based on the equations [2] and [3]. Based on a determination that K1 does equal K2 (e.g., "yes"), the positional algorithm receives an enable HIGH and then calculates the position for the LVDT. However, if K1 does not equal K2, there is a fault condition and the enable logic remains LOW so that the positional algorithm does not compute the position for the LVDT. After enabling logic low in block 514, the method 500 includes decision block 516 which checks to see if all gain sets are over. If yes, the method 500 continues to C. If no, the method 500 continues to block 518 and declares a system fault.

In one or more embodiments, the control circuitry 320, 420 or any of the hardware referenced in the systems 300, 400 or any of the algorithms can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

Figure 6:
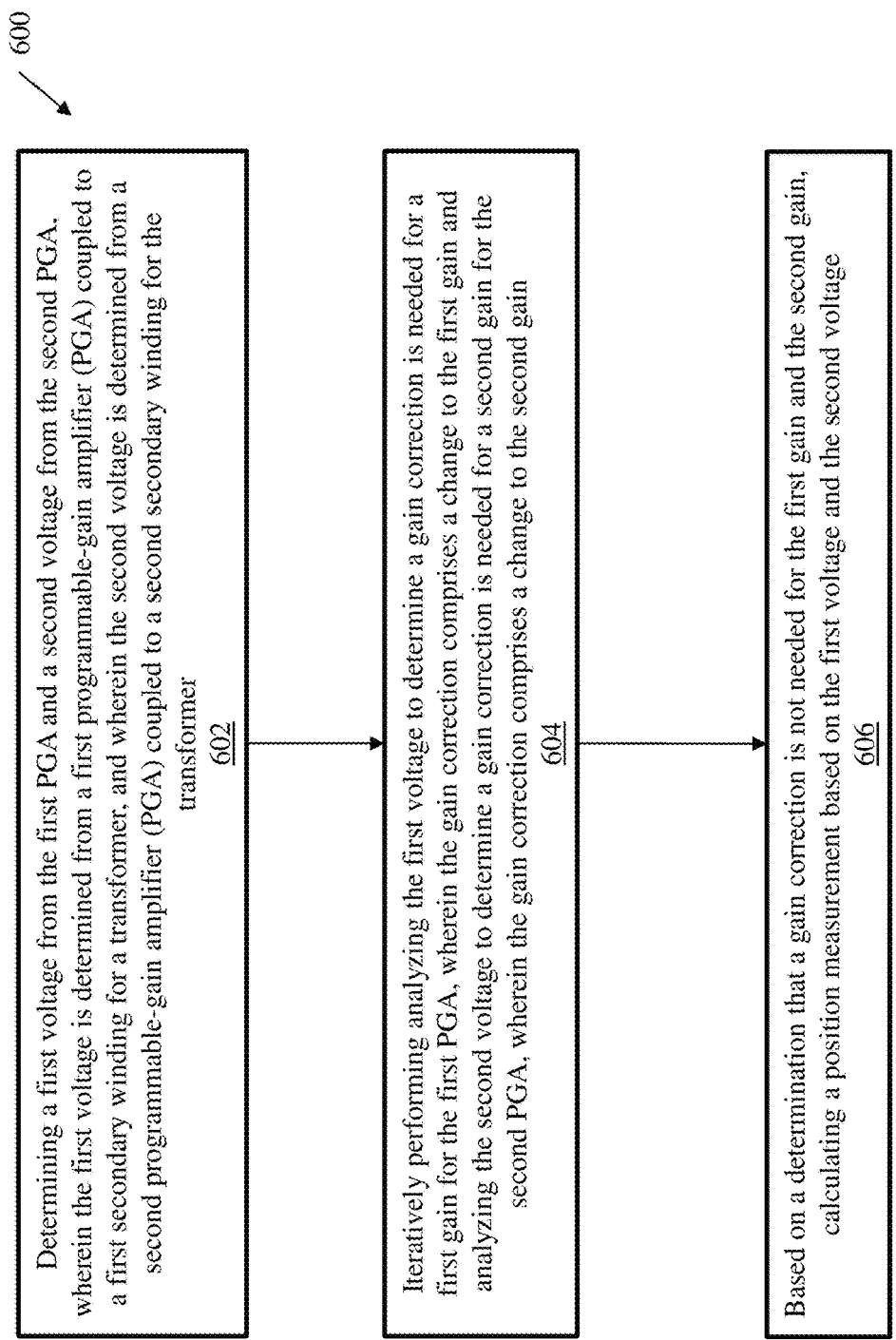
FIG. 6 depicts a flow diagram of a method for operating an LVDT according to one or more embodiments.

FIG. 6 depicts a flow diagram of a method for operating an LVDT according to one or more embodiments. The method 600 includes determining a first voltage from the first PGA and a second voltage from the second PGA, wherein the first voltage is determined from a first programmable-gain amplifier (PGA) coupled to a first secondary winding for a transformer, and wherein the second voltage is determined from a second programmable-gain amplifier (PGA) coupled to a second secondary winding for the transformer, as shown at block 602. At block 604, the method 600 includes iteratively performing analyzing the first voltage to determine a gain correction is needed for a first gain for the first PGA, wherein the gain correction comprises a change to the first gain and analyzing the second voltage to determine a gain correction is needed for a second gain for the second PGA, wherein the gain correction comprises a change to the second gain. And based on a determination that a gain correction is not needed for the first gain and the second gain, the method 600 includes calculating a position measurement based on the first voltage and the second voltage, as shown in block 606.

Additional processes may also be included. It should be understood that the processes depicted in FIG. 6 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
a transformer comprising a plurality of secondary windings, the plurality of secondary windings comprising a first secondary winding and a second secondary winding;
a first programmable-gain amplifier (PGA) coupled to the first secondary winding;
a second programmable-gain amplifier (PGA) coupled to the second secondary winding; and
a controller including a first input configured to receive a first digital signal indicative of a first voltage output from the first PGA, a first output configured to establish a first gain control feedback signal path with the first PGA, a second voltage input configured to receive a second digital signal indicative of a second voltage output from the second PGA, and a second output configured to establish a second gain control feedback signal path with the second PGA,
the controller configured to:
determine the first voltage output from the first PGA and the second voltage output from the second PGA;
iteratively perform:
compare the first voltage to a first threshold voltage to determine a gain correction is needed for a first gain for the first PGA, wherein the gain correction comprises outputting a first gain control signal to the first PGA via the first gain control feedback signal path to a change to the first gain; and
compare the second voltage to a second threshold voltage to determine a gain correction is needed for a second gain for the second PGA, wherein the gain correction comprises outputting a second gain control signal to the second PGA via the second gain control feedback signal path to change to the second gain; and
based on a determination that a gain correction is not needed for the first gain and the second gain, calculate a position measurement based on the first voltage and the second voltage;
wherein the calculating the position measurement based on the first voltage and the second voltage comprises:
receiving an enable signal; and
executing a position algorithm using the first voltage and the second voltage.

2. The system of claim 1, wherein determining the gain correction is needed for the first gain for the first PGA comprises:
determining that the first voltage is less than the first threshold voltage, wherein the change in the first gain comprises a stepwise increase to the first gain.

3. The system of claim 2, wherein determining the gain correction is needed for the first gain for the first PGA further comprises:
determining that the first voltage is greater than the second threshold, wherein the change in the first gain comprises a stepwise decrease to the first gain.

4. The system of claim 3, wherein the determining the gain correction is not needed for the first gain comprises:
determining that the first voltage is greater than the first threshold voltage and less than the second threshold voltage.

5. The system of claim 1, wherein determining the gain correction is needed for the second gain for the second PGA comprises:
determining that the second voltage is less than the first threshold voltage, wherein the change in the second gain comprises a stepwise increase to the second gain.

6. The system of claim 5, wherein determining the gain correction is needed for the second gain for the first PGA further comprises:
determining that the second voltage is greater than the second threshold, wherein the change in the second gain comprises a stepwise decrease to the second gain.

7. The system of claim 6, wherein the determining the gain correction is not needed for the second gain comprises:
determining that the second voltage is greater than the first threshold voltage and less than the second threshold voltage.

8. The system of claim 1, wherein the transformer is a linear differential transformer.

9. The system of claim 8, wherein the transformer further comprises a moveable core attached to an aircraft component.

10. A method comprising:
outputting, to a controller, a first digital signal indicative of a first voltage output from a first programmable-gain amplifier (PGA) and outputting, to the controller, a second digital signal indicative of a second voltage output from a second programmable-gain amplifier (PGA);
determining, by the controller, the first voltage output from the first PGA based on the first digital signal and a second voltage output from the second PGA based on the second digital signal, wherein the first PGA is coupled to a first secondary winding of a transformer, and wherein the second PGA is coupled to a second secondary winding of the transformer;
wherein the transformer comprising a plurality of secondary windings, the plurality of secondary windings comprising the first secondary winding and the second secondary winding;
iteratively performing:
comparing, by the controller, the first voltage to a first threshold voltage to determine a gain correction is needed for a first gain for the first PGA, wherein the gain correction comprises outputting a first gain control signal to the first PGA via a first gain control feedback signal path to change to the first gain; and
comparing the second voltage to a second threshold voltage to determine a gain correction is needed for a second gain for the second PGA, wherein the gain correction comprises outputting a second gain control signal to the second PGA via a second gain control feedback signal path to change to the second gain;
based on a determination that a gain correction is not needed for the first gain and the second gain, calculating a position measurement based on the first voltage and the second voltage;
wherein the calculating the position measurement based on the first voltage and the second voltage comprises:
receiving an enable signal; and
executing a position algorithm using the first voltage and the second voltage.

11. The system of claim 10, wherein determining the gain correction is needed for the first gain for the first PGA comprises:
determining that the first voltage is less than the first threshold voltage, wherein the change in the first gain comprises a stepwise increase to the first gain.

12. The system of claim 11, wherein determining the gain correction is needed for the first gain for the first PGA further comprises:
determining that the first voltage is greater than the second threshold, wherein the change in the first gain comprises a stepwise decrease to the first gain.

13. The system of claim 12, wherein the determining the gain correction is not needed for the first gain comprises:
determining that the first voltage is greater than the first threshold voltage and less than the second threshold voltage.

14. The system of claim 10, wherein determining the gain correction is needed for the second gain for the second PGA comprises:
determining that the second voltage is less than the first threshold voltage, wherein the change in the second gain comprises a stepwise increase to the second gain.

15. The system of claim 14, wherein determining the gain correction is needed for the second gain for the first PGA further comprises:
determining that the second voltage is greater than the second threshold, wherein the change in the second gain comprises a stepwise decrease to the second gain.

16. The system of claim 15, wherein the determining the gain correction is not needed for the second gain comprises:
determining that the second voltage is greater than the first threshold voltage and less than the second threshold voltage.

17. The system of claim 10, wherein the transformer is a linear differential transformer.

18. The system of claim 17, wherein the transformer further comprises a moveable core attached to an aircraft component.

* * * * *